United States Patent [19]

Honma

[11] Patent Number: 5,083,151
[45] Date of Patent: Jan. 21, 1992

[54] DEVELOPER DEPOSITING UNIT FOR AN IMAGE FORMING APPARATUS

[75] Inventor: Yoshiyasu Honma, Nagoya, Japan

[73] Assignee: Brother Kogyo Kabushiki Kaisha, Nagoya, Japan

[21] Appl. No.: 693,609

[22] Filed: Apr. 30, 1991

[30] Foreign Application Priority Data

Jun. 15, 1990 [JP] Japan .................. 2-63745[U]

[51] Int. Cl.⁵ ............................................. G03B 27/52
[52] U.S. Cl. ...................................... 355/27; 118/651
[58] Field of Search ................ 355/246, 250, 259, 274, 355/275; 118/621, 626, 637, 639, 644, 651, 653, 656, 657

[56] References Cited

U.S. PATENT DOCUMENTS

| | | | |
|---|---|---|---|
| 3,643,311 | 2/1972 | Knechtel et al. | 29/125 |
| 3,653,758 | 4/1972 | Trimmer et al. | 118/637 |
| 3,664,857 | 5/1972 | Miller | 118/637 X |
| 3,938,739 | 2/1976 | Bertilsson et al. | 118/626 |
| 4,268,943 | 5/1981 | Watanabe et al. | 118/651 |
| 4,387,980 | 6/1983 | Ueno et al. | 118/651 X |
| 4,408,862 | 10/1983 | Takano et al. | 118/656 X |
| 4,646,677 | 3/1987 | Lounsbury, Jr. et al. | 118/653 |
| 4,797,335 | 1/1989 | Hiratsuka et al. | 118/657 |
| 4,836,136 | 6/1989 | Natsuhara | 118/657 |
| 4,930,430 | 6/1990 | Demizu et al. | 118/651 |

FOREIGN PATENT DOCUMENTS

| | | |
|---|---|---|
| 63-170660 | 7/1988 | Japan . |
| 1-85855 | 7/1989 | Japan . |
| 1-143195 | 12/1989 | Japan . |
| 2-261558 | 10/1990 | Japan . |
| 3-23985 | 1/1991 | Japan . |
| 3-23465 | 3/1991 | Japan . |
| 3-23466 | 3/1991 | Japan . |
| 3-23468 | 3/1991 | Japan . |
| 3-48846 | 3/1991 | Japan . |

Primary Examiner—L. T. Hix
Assistant Examiner—D. Rutledge
Attorney, Agent, or Firm—Oliff & Berridge

[57] ABSTRACT

In a developer depositing unit for an image forming apparatus, a developer is supplied to a developer carrying roller by a supply roller. The developer is charged by the frictional charge produced by contact between the supply roller and the developer carrying roller. The charged developer is displaced from the developer carrying roller to an ordinary sheet of paper, as the sheet of paper is passed around an electrode roller, to be thus electrostatically deposited on a sheet. A ground conductive brush is positioned to contact both the supply roller and the developer carrying roller to remove any excessive built-up charge on the supply roller and the developer carrying roller. The brush also prevents a build-up of developer on both rollers that could result in their becoming clogged.

17 Claims, 3 Drawing Sheets

DEVELOPER DEPOSITING UNIT FOR AN IMAGE FORMING APPARATUS

BACKGROUND OF THE INVENTION

1. Field of the Invention

The present invention relates to a developer depositing unit for an image forming apparatus for electrostatically depositing a charged developer on a support member such as an ordinary sheet of paper.

2. Description of the Related Art

There has been conventionally put into practical use a color copying machine, for example, where a microcapsule sheet, exposed to light, is then superposed on a developing sheet and subjected to a pressure-developing process, thus forming the copied image on the developing sheet. The developing sheets used, that is those on the market, have been coated with a developer for specific use in a color copying machine. However, the requirement to use specialized developing sheets, that may be specific to the microcapsule sheet, cause stockage problems both in terms of timely availability and space for storage. To address this problem, a developer depositing unit capable of easily manufacturing the developing sheet using of an ordinary sheet of paper is disclosed, for example, in Japanese Patent Application No. 63-170660 (now Japanese Utility Model Laid-Open Publication No. 2-90840) by the same inventor as the present invention.

In such a unit, a carrier roller for carrying charged particles of developer is positioned in non-contacting face-to-face relationship with a support member, such as an ordinary sheet of paper, so that the developer is deposited on the support member by static electricity produced in an electric field. In another unit of this type which improves on the amount of charged developer deposited on the ordinary sheet, a frictional charge on a carrier roller and a supply roller is used. Moreover, there is also a unit having a supply roller and a carrier roller which has grooves, for the purpose of carrying an increased amount of developer for deposit on the ordinary sheet, disclosed in U.S. patent application Ser. No. 496,304, assigned to the same assignee as the present invention. The referenced patent application also discloses a second blade for removing clogged developer from and for grounding the developer carrying roller. However, the second blade does neither task effectively.

As indicated, in the developer depositing units described above, there are problems caused by the build-up of a charge on either the carrier roller or the supply roller, or both, such that the amount of developer that may be transferred to the ordinary sheet decreases over time. Further, the amount of transferable developer carried may be reduced due to the clogging of the carrier roller or the supply roller by packed, dense developer. As a result, the amount of developer deposited on the ordinary sheet support member is reduced. It is these problems that are addressed and solved by the invention as the previously described solution has proven to be ineffective.

SUMMARY OF THE INVENTION

It is an object of this invention to provide a developer depositing unit for an image forming apparatus, capable of uniformly depositing developer on a support member.

It is another object of this invention to provide a developer depositing unit for an image forming apparatus capable of preventing a quantitative decrease of the developer charged by a developer carrying roller and a supply roller so as to uniformly deposit the developer on a support member.

It is a further object of this invention to provide a developer depositing unit for an image forming apparatus capable of preventing the clogging of developer on the developer carrying roller or the supply roller so as to uniformly deposit the developer on a supply member.

In order to attain the above and other objects, according to this invention, in a developer depositing unit for an image forming apparatus having a developer carrying roller for carrying charged particles of developer, a supply roller for supplying the developer to the developer carrying roller, an electrode roller for attracting the developer to the support member wherein the electrode roller is disposed opposite to the developer carrying roller at a predetermined distance, and the developer depositing unit electrostatically depositing the developer on the support member conveyed by a conveyor means, the invention comprises a grounded conductive brush arranged to contact both the supply roller and the developer carrying roller.

In the developer depositing unit for the image forming apparatus according to the invention as described above, the developer is supplied to the developer carrying roller by the supply roller so as to be frictionally charged by the developer carrying roller and the supply roller. The charged developer is displaced from the developer carrying roller toward the electrode roller to be electrostatically deposited on the support member. The grounded conductive brush, contacting both the supply roller and the developer carrying roller, removes the charge remaining in the supply roller and the developer carrying roller after displacement of the developer and further, removes any remaining developer from both rollers that might produce clogging.

As is obvious from the above explanation, the grounded conductive brush is mounted to contact both the supply roller and the developer carrying roller and thereby remove any remaining charge on the supply roller and/or the developer carrying roller and, further, eliminates the developer building upon and potentially clogging the rollers, thereby increasing both the charged amount and the transferable amount of developer carried by the developer carrying roller. Therefore, the required amount of developer can be uniformly deposited on the support member with an easy displacement or transfer of the developer from the developer carrying roller.

BRIEF DESCRIPTION OF THE DRAWINGS

A preferred embodiment of the present invention will be described in detail with reference to the following figures, wherein.

DESCRIPTION OF THE PREFERRED EMBODIMENT

The present invention will be described in detail by way of an example of an application thereof to a color image forming apparatus.

Figure 1:
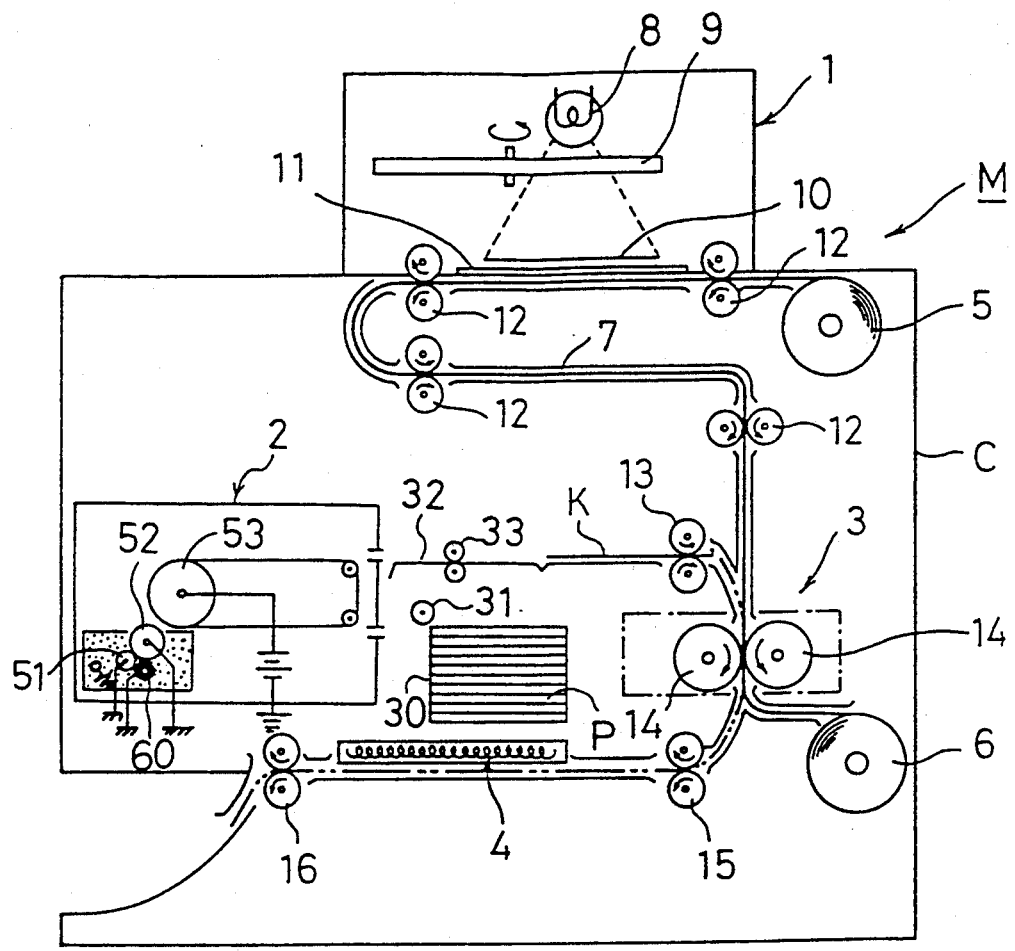
FIG. 1 is a side view of a color image forming apparatus according to the invention.

As shown in FIG. 1, a color image forming apparatus M is provided with an exposure unit 1 for exposing a microcapsule sheet 7, traveling between a sheet feeding roller 5 and a take-up roller 6, to light through an original mask 10. A developer depositing unit 2 is positioned in the housing C of the color image forming apparatus M. A pressure-developing unit 3 is also mounted in the housing C near the developer depositing unit 2. In the pressure-developing unit 3, the earlier exposed microcapsule sheet 7 and a developing sheet K, comprising developer S deposited on an ordinary sheet P by the developer depositing unit 2, are developed under pressure, when in a superposed relationship, to form a color image on the developing sheet K. The developing sheet K is an ordinary sheet P having a developer S deposited on one surface in depositing unit 2 before being fed to pressure developing unit 3. After the pressure developing process in the pressure-developing unit 3, the developing sheet K is fed to a heat fixing unit 4 where a fixing operation for the pressure developed image is carried out.

The exposure unit 1 uses a halogen lamp 8 as the light source during exposure of the microcapsule sheet 7. Mounted under the halogen lamp 8 is a rotatable color separating filter 9 for three primary colors. The original mask 10 is placed on an original stand 11 below the color separating filter 9. A pair of guide rollers 12 is placed at each end of the original stand 11. The superposed developing sheet K and microcapsule sheet 7 are fed between a pair of pressure rollers 14 housed in the pressure-developing unit 3, after a pair of guide rollers 13 have directed the developing sheet K to the nip between pressure rollers 14, to be developed under pressure by the pressure rollers 14. The microcapsule sheet 7, after passing through the pressure-developing unit 3, is collected by the take-up roller 6. The developing sheet K, after passing through the pressure-developing unit 3 is fed to the heat fixing unit 4 by a pair of guide rollers 15 and is subsequently discharged outside the housing C by another pair of guide rollers 16.

Figure 2:
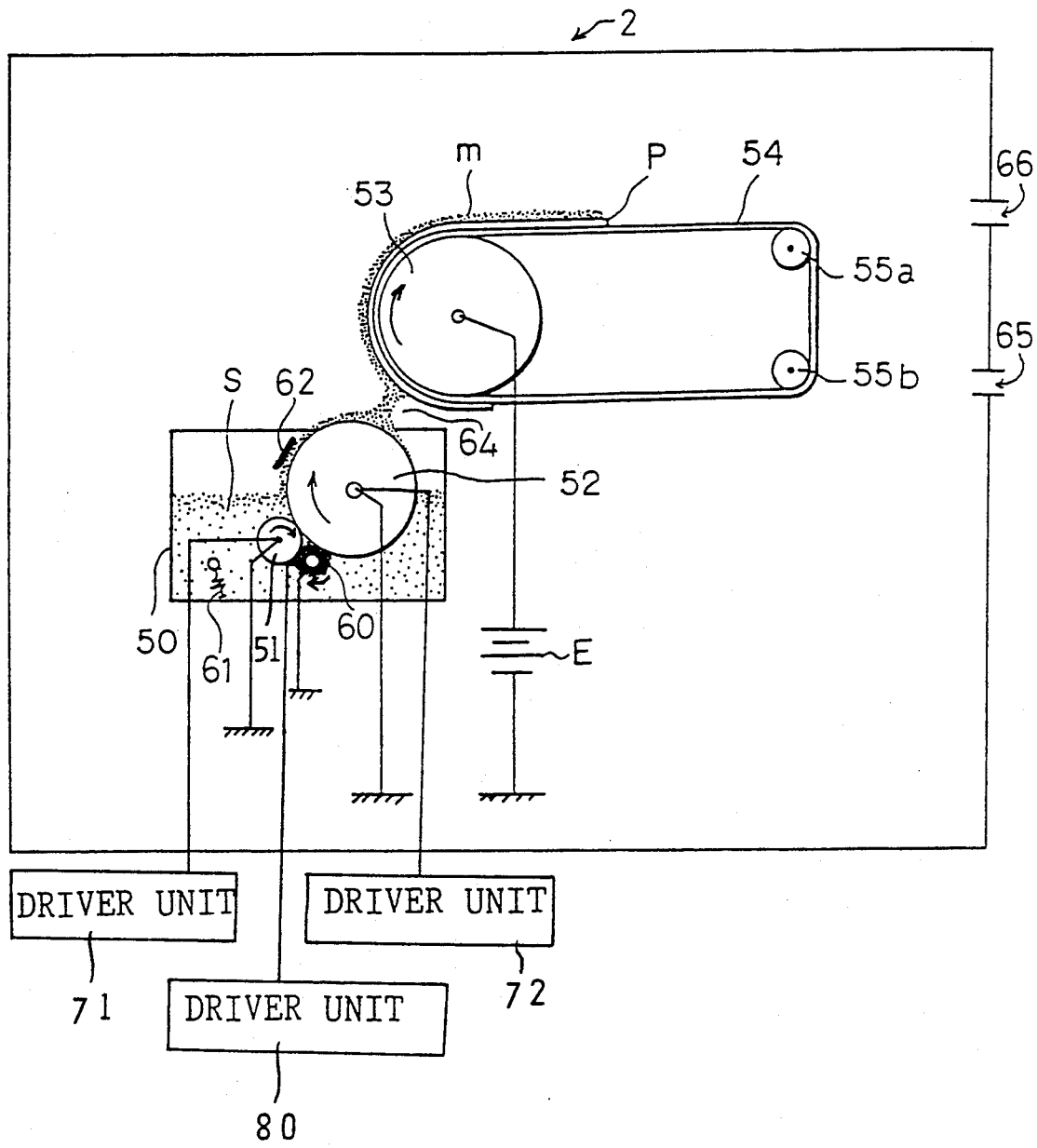
FIG. 2 is an enlarged side view a first embodiment of the developer depositing unit of the color image forming apparatus of FIG. 1.

The developer depositing unit 2, shown in detail in FIG. 2, has a developer carrying roller 52 and an electrode roller 53 with a predetermined interval therebetween. The ordinary sheet P, that is to become developing sheet K, is conveyed through the interval between the rollers 52,53 by conveyor belt 54 that is wound around the electrode roller 53 and a couple of guide rollers 55a, 55b. The outer surface of the developer carrying roller 52 is separated a preset distance from the surface of ordinary sheet P as carried by conveyor belt 54.

The developer carrying roller 52 is mounted inside a developer case 50 for storing particles of developer S. Between the developer carrying roller 52 and the electrode roller 53, an electric charge differential is generated by a power source E for transfer of the developer S from the developer carrying roller 52 to the ordinary sheet P, as a support member, to produce developing sheet K. On the upstream side of a developer depositing region 64, in the rotary direction of the developer carrying roller 52, a rotatable supply roller 51 is pressed into contact with the developer carrying roller 52. A grounded conductive brush roller 60 is positioned adjacent the nip between the developer carrying roller 52 and the rotatable supply roller 51 so that the outer surface of the conductive brush roller 60 contacts the surface of both of the developer carrying roller 52 and the supply roller 51. Driver units 71, 72 are provided for rotating the supply roller 51 and the developer carrying roller 52 in a clockwise direction as shown in FIG. 2. A driver unit 80 is provided for rotating the conductive brush roller 60 in a clockwise direction (FIG. 2) and can change the rotation speed of the conductive brush roller 60 relative to the rotation speed of the supply roller 51 or developer carrying roller 52 to effectively prevent the clogging of both rollers 51, 52. The developer case 50 also has mounted therein an agitator 61 for agitating the developer S and a blade 62 for uniformly smoothing and limiting the thickness of the layer of developer S deposited on developer carrying roller 52.

The operation of the color image forming apparatus M will now be explained.

After the original mask 10 is mounted on the original stand 11, the image copying operation is started by use of a start switch. The halogen lamp 8 is lit to form a latent image of the original mask 10 on a portion of the microcapsule sheet 7 between the sheet feeding roller 5 and the take-up roller 6. A pair of guide rollers 12 is positioned at each end original stand 11. The exposed portion of the microcapsule sheet 7, after the exposure to light in the exposure unit 1, is fed into the pressure developing unit 3 by another pair of guide rollers 12 positioned downstream of the guide rollers 12 at each end of the original stand 11.

Meanwhile, in the developer depositing unit 2, the agitator 61 moves the developer S toward the supply roller 51 which, in turn, directs the developer S to the developer carrying roller 52. The developer S is then pressed against, and excess developer S removed from, the developer carrying roller 52 by the blade 62, disposed on the downstream side of the supply roller 51 as defined by the rotary direction of the developer carrying roller 52, to be transported to the depositing region 64.

During this stage, the developer S is charged by the frictional contact between the developer carrying roller 52 and the supply roller 51. Although it is necessary the developer carrying roller 52 and the supply roller 51 be charged to transport the proper amount of developer S to the depositing region 64, the grounded conductive brush roller 60 is in rotating contact with the surface of both the developer carrying roller 52 and the supply roller 51 during their rotation to remove any residual charge. Furthermore, clogging of the developer carrying roller 52 and the supply roller 51 with excessive packed developer S is mechanically prevented by the rotation of the grounded conductive brush roller 60. Although all rollers 51, 52 and 60 are rotating in a clockwise direction, by their positioning the surfaces in contact are effectively moving in an opposite direction to one another. This increases the effectiveness of the conductive roller brush 60 in removing packed developer from the supply roller 51 and the developer carrying roller 52.

The ordinary sheets P, stacked in a sheet feeding cassette 30, are fed one after another into an inlet 65 of the developer depositing unit 2 by a kicking roller 31. The inlet 65 is disposed below an outlet 66 for discharging the developing sheet K after a layer (m) of developer is formed on the ordinary sheet P. The developing sheet K is discharged through the outlet 66 and fed toward the pressure-developing unit 3 along a guide plate 32 by a pair of feeding rollers 33.

The particles of developer S, deposited as a layer (m) of developer on developing sheet K, are held in the developer case 50. Housed inside the developer case 50 are the rotatable developer carrying roller 52 and the supply roller 51. The two rollers 51,52 are in pressurized contact with one another. The developer carrying roller 52 and the supply roller 51 are rotated to be frictionally charged on the contact surfaces thereof, which produces a positively charged developer S. The positively charged developer S is deposited on the outer surface of the developer carrying roller 52 and is attracted toward the negatively charged electrode roller 53 opposite to, but a predetermined distance away from, the developer carrying roller 52. A negative voltage is applied to the electrode roller 53 by the power source E, as the conveyor belt 54 carrying the ordinary sheet P moves around the electrode roller 53 and the guide rollers 55a, 55b, and when the ordinary sheet P passes through the most proximate point of the developer carrying roller 52 and the electrode roller 53, the positively charged particles of developer S are deposited onto the ordinary sheet P to form the layer (m) of developer thereon. As a result, an ordinary sheet P is converted into a developing sheet K.

In the color image forming apparatus M in this embodiment, as apparent from the above description, the built-up charge on the supply roller 51 and the developer carrying roller 52 can be removed and excessive build-up of developer S that clogs the rollers 51,52 can be eliminated by the grounded conductive brush roller 60 positioned to contact both the supply roller 51 and the developer carrying roller 52. Accordingly, the charged and carried amount of developer can be may uniformly deposited on an ordinary sheet P with a very inexpensive apparatus.

Figure 3:
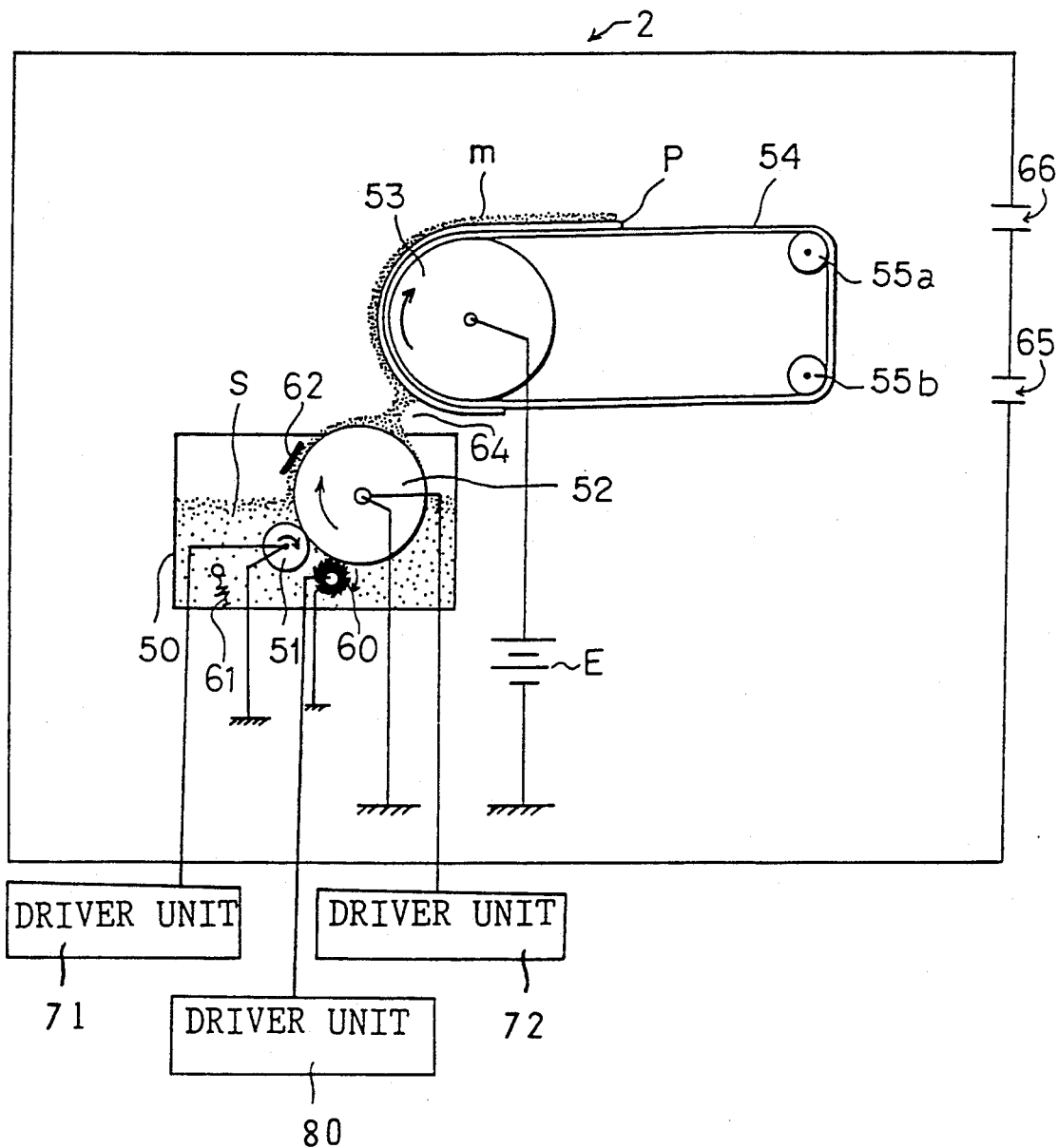
FIG. 3 is an enlarged side view of a second embodiment of the developer depositing unit of a color image forming apparatus.

A second embodiment of the invention is shown in FIG. 3. In this embodiment, the grounded conductive brush roller 60 is positioned so that it only makes rotating contact with the developer carrying roller 52. The grounded conductive brush roller 60 is mounted in the developer case 50 below but slightly forward of a vertical plane passing through the axis of the developer carrying roller 52 in the direction of rotation of the developer carrying roller 52. With this positioning, the effective life of the grounded conductive brush roller 60 is extended while providing substantially the same results in removing excessive static charge and densely packed developer S, that produces clogging, from developer carrying roller 52.

Various modifications can be made without deviating from the scope to the invention. For example, the developer S may be deposited not on the ordinary sheet P but rather directly on the microcapsule sheet 7 having the latent image thereon. In addition, the conductive brush roller 60 may be vibrated or stationary rather than rotated as disclosed.

What is claimed is:

1. In a developer depositing unit for an image forming apparatus having a carrying member for carrying a developer and a supplying member for supplying the developer to the carrying member, the developer depositing unit electrostatically depositing the developer on a support member by frictional charging of the developer by the carrying member and the supplying member to displace the frictionally charged developer onto the support member by use of an oppositely charged attracting means to the frictionally charged developer, an improvement comprising a grounded conductive brush in contact with at least the carrying member.

2. In a developer depositing unit as claimed in claim 1, wherein said grounded conductive brush is in contact with both the carrying member and the supplying member.

3. In a developer depositing unit as claimed in claim 1, further comprising a drive unit for rotating said grounded conductive brush.

4. In a developer depositing unit as claimed in claim 3, wherein at a point of contact between a surface of said grounded conductive brush and a surface of at least said carrying member, said surfaces are rotating in opposite directions to one another.

5. In a developer depositing unit as claimed in claim 3, wherein a rotating speed of said conductive brush roller is variable.

6. In an image forming apparatus having an exposure unit for exposing a microcapsule sheet to light to form a latent image, a developer depositing unit for depositing a developer on an ordinary sheet, a pressure developing unit for pressure-developing a visible image on the ordinary sheet coated with the developer when the developer coated ordinary sheet is superposed on the exposed microcapsule sheet, and a heat fixing unit for thermally fixing the visible image on the ordinary sheet, said developer depositing unit comprising:
   a developer carrying roller for carrying charged particles of developer;
   a supply roller for supplying the developer to said developer carrying roller;
   an electrode roller disposed opposite to said developer carrying roller at a predetermined distance; and
   a grounded conductive brush in contact with at least said developer carrying roller.

7. In an image forming apparatus as claimed in claim 6, wherein said grounded conductive brush is in contact with both the developer carrying roller and the supply roller.

8. In an image forming apparatus as claimed in claim 6, further comprising:
   at least one drive unit for rotating said supply roller and said developer carrying roller; and
   a further drive unit for rotating said conductive brush.

9. In an image forming apparatus as claimed in claim 8, wherein said conductive brush can be rotated at different speeds by said further drive unit.

10. In an image forming apparatus as claimed in claim 8, wherein at a point of contact between a surface of said conductive brush and a surface of at least said developer carrying roller, said surfaces are rotating in opposite directions to one another.

11. A device for producing a developing sheet, comprising:
   a case for a developer depositing unit;
   a developer reservoir mounted in said case;
   a developer carrying roller mounted in said developer reservoir;
   a supply roller mounted in said developer reservoir so as to be in pressurized, frictional contact with said developer carrying roller;

an electrode roller mounted in said case near to but a predetermined distance from said developer carrying roller; and a conductive brush mounted in said developer reservoir in contact with at least said developer carrying roller.

12. A device as claimed in claim 11, wherein said conductive brush is grounded.

13. A device as claimed in claim 11, wherein said conductive brush is rotatable.

14. A device as claimed in claim 11, wherein said grounded conductive brush is in contact with both the developer carrying roller and the supply roller.

15. A device as claimed in claim 11, further comprising:

at least one drive unit for rotating said supply roller and said developer carrying roller; and a further drive unit for rotating said conductive brush.

16. A device as claimed in claim 15, wherein said conductive brush can be rotated at different speeds by said further drive unit.

17. A device as claimed in claim 15, wherein at a point of contact between a surface of said conductive brush and a surface of at least said developer carrying roller, said surfaces are rotating in opposite directions to one another.

* * * * *